United States Patent [19]
Hedgcoth

[11] Patent Number: 5,437,778
[45] Date of Patent: * Aug. 1, 1995

[54] SLOTTED CYLINDRICAL HOLLOW CATHODE/MAGNETRON SPUTTERING DEVICE

[75] Inventor: Virgle L. Hedgcoth, Pomona, Calif.

[73] Assignee: Telic Technologies Corporation, Santa Monica, Calif.

[*] Notice: The portion of the term of this patent subsequent to Dec. 17, 2008 has been disclaimed.

[21] Appl. No.: 152,916

[22] Filed: Nov. 15, 1993

Related U.S. Application Data

[63] Continuation of Ser. No. 809,705, Dec. 16, 1991, abandoned, which is a continuation-in-part of Ser. No. 550,719, Jul. 10, 1990, Pat. No. 5,073,245.

[51] Int. Cl.$^6$ ............................................. C23C 14/34
[52] U.S. Cl. .................... 204/298.21; 204/298.12; 204/298.18; 204/298.26; 204/192.12
[58] Field of Search .............. 204/192.12, 298.09, 204/298.12, 298.14, 298.18, 298.21, 298.22, 298.23, 298.24, 298.26

[56] References Cited

U.S. PATENT DOCUMENTS

| | | | |
|---|---|---|---|
| 2,146,025 | 2/1939 | Penning | 250/27.5 |
| 3,616,450 | 10/1971 | Clark | 204/298 |
| 3,619,402 | 11/1972 | Wurm et al. | 204/298 |
| 3,711,398 | 1/1973 | Clarke | 204/298 |
| 3,878,085 | 4/1975 | Corbani | 204/298 |
| 3,884,793 | 5/1975 | Penfold | 204/298 |
| 4,126,530 | 11/1978 | Thorton | 204/192 EC |
| 4,132,613 | 1/1979 | Penfold | 204/192 R |
| 4,166,018 | 8/1979 | Chapin | 204/192 R |
| 4,169,031 | 9/1979 | Brors | 204/192.12 |
| 4,204,936 | 5/1980 | Hartsough | 204/298.12 XR |
| 4,290,877 | 9/1981 | Blickensderfer | 204/298 |
| 4,299,678 | 11/1981 | Meckel | 204/298.12 XR |
| 4,309,261 | 1/1982 | Harding et al. | 204/298 XR |
| 4,356,073 | 10/1982 | McKelvey | 204/192 R |
| 4,422,916 | 12/1983 | McKelvey | 204/192 R |
| 4,472,259 | 9/1984 | Class et al. | 204/298 |
| 4,530,750 | 7/1985 | Aisenberg et al. | 204/298.24 |
| 4,622,121 | 11/1986 | Wegmann | 204/298 |
| 4,724,060 | 2/1988 | Sakata et al. | 204/298.11 |
| 4,763,601 | 8/1988 | Saida et al. | 204/298.24 XR |
| 4,814,056 | 3/1989 | Welty | 204/298.26 XR |
| 4,915,805 | 4/1990 | Rust | 204/192.12 |
| 4,933,057 | 6/1990 | Sebastiano et al. | 204/192.12 |
| 4,960,753 | 10/1990 | Collins et al. | 204/298.21 XR |
| 4,966,677 | 10/1990 | Aichert et al. | 204/298.21 |
| 5,057,199 | 10/1991 | Lievens et al. | 204/298.24 XR |
| 5,073,245 | 12/1991 | Hedgcoth | 204/298.21 |

OTHER PUBLICATIONS

"Collimated magnetron sputter deposition" by S. M. Rossnagel et al., Mar. 1991.
"Tubular Hollow Cathode Sputtering Onto Substrates of Complex Shape" by Thorton et al., Sep. 16, 1974.
"Cylindrical Magnetron Sputtering" by Thorton et al., from *Thin Film Processes*, 1948.
"Plasmas in Dposition Processes," by John A. Thorton, reproduced from *Deposition Technologies for Films and Coatings–Developments and Applications*, by Bunshae et al., 1982.
"C-Mag rotatable magnetron Cathode" by Hofman, Airco Coating Technology brochure (Date Unknown).

*Primary Examiner*—Nam Nguyen
*Attorney, Agent, or Firm*—Price, Gess & Ubell

[57] ABSTRACT

The invention is an expandable magnetron sputtering system based on an elongated hollow cylindrical cathode member. A magnetic field is provided parallel to an axial wall of the hollow cathode member to create a physical trap for containing a glow discharge therein. Removable end plugs are provided, if necessary, to help create the physical trap. The hollow cathode member may be solid or any contain one or more slots, as appropriate, for the substrate to be coated (filament-like versus planar) and the mode of operation selected (pass-by versus pass-through). The cathode members may be connected together (with anodes as needed) to extend the length of a sputtering path. A plurality of single-slot cathodes may be cost effectively formed and operated in a single monolithic slab of material.

6 Claims, 15 Drawing Sheets

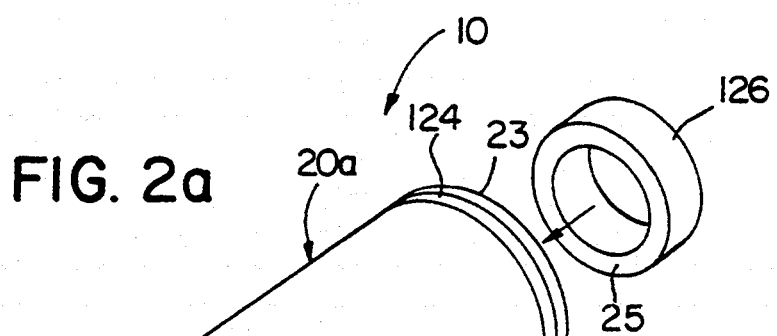
FIG. 2a
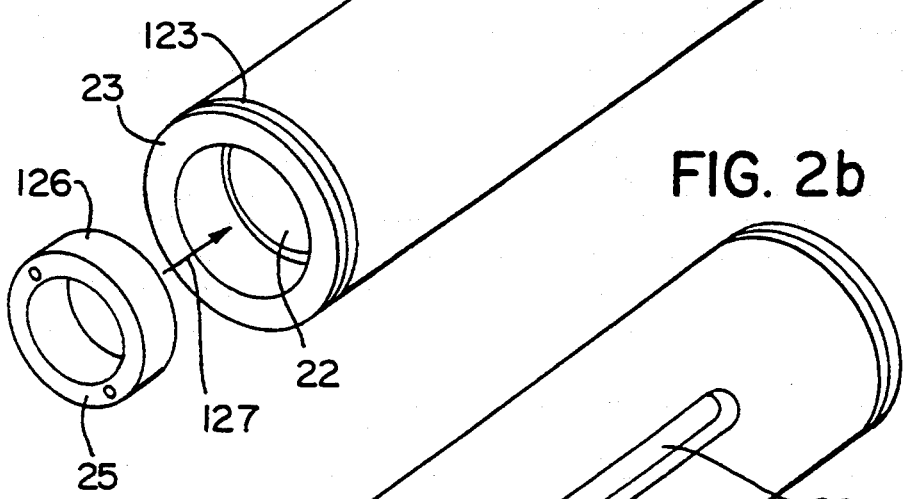
FIG. 2b
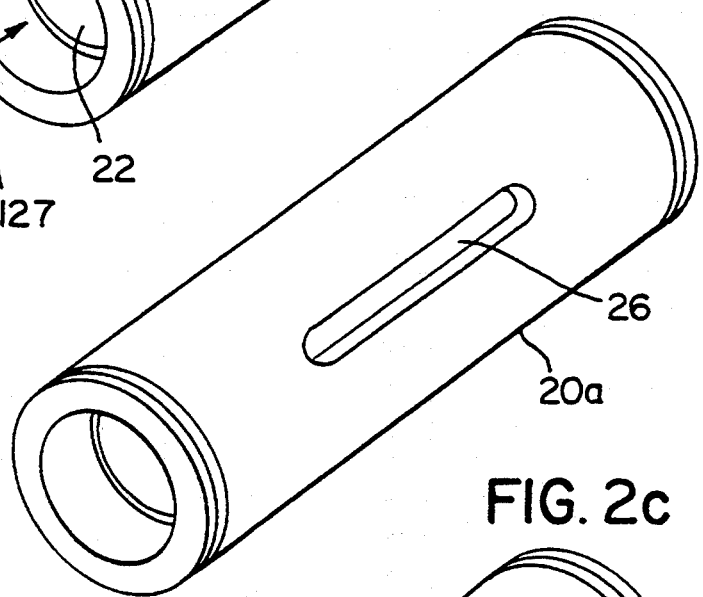
FIG. 2c
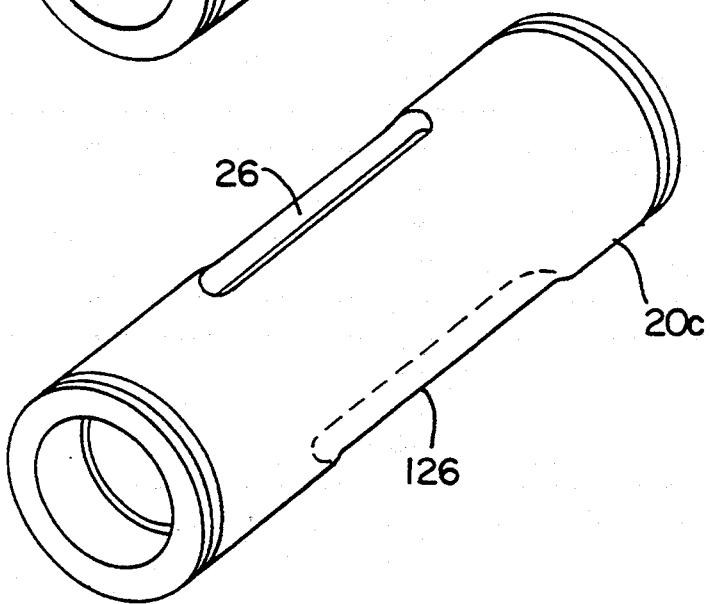

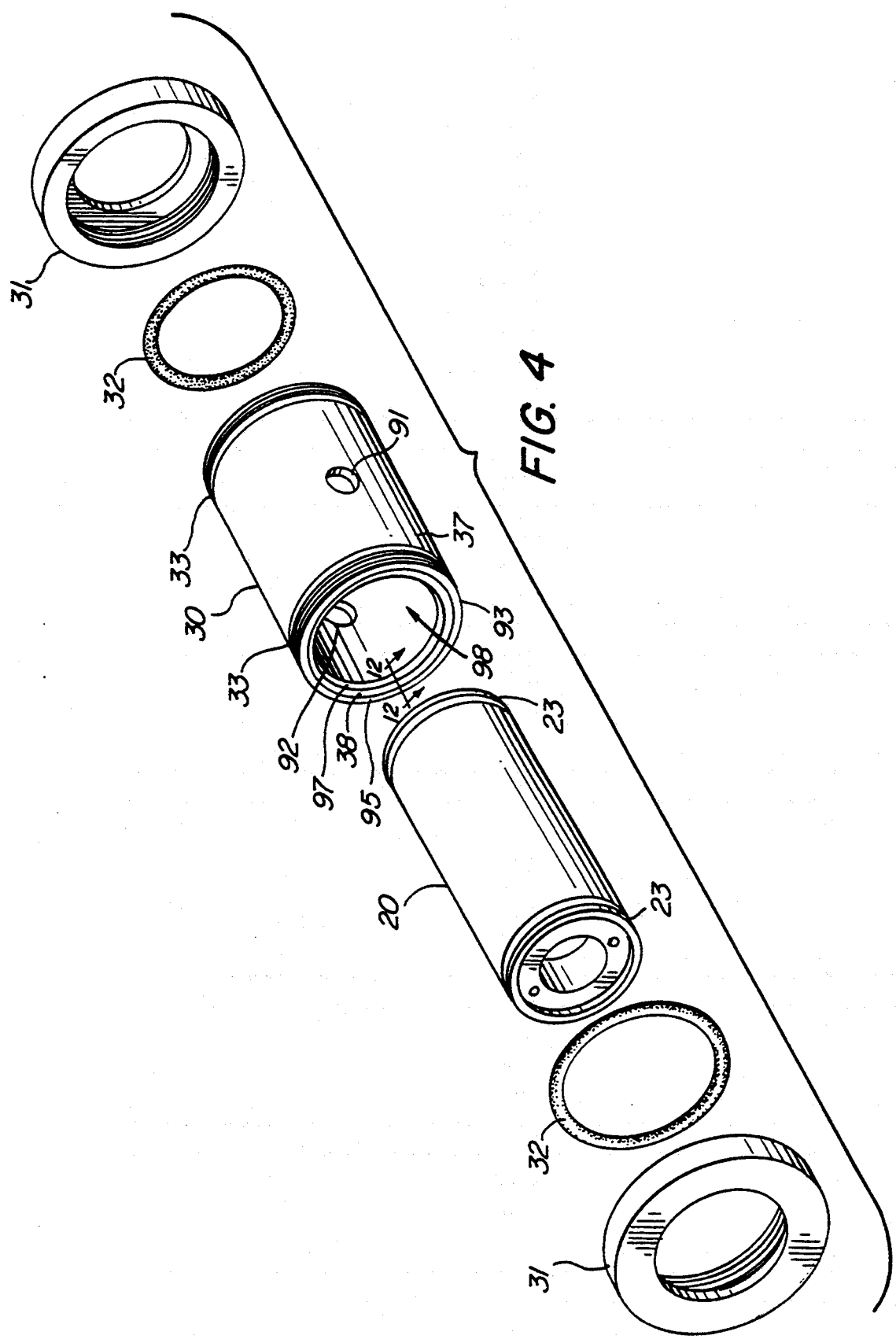

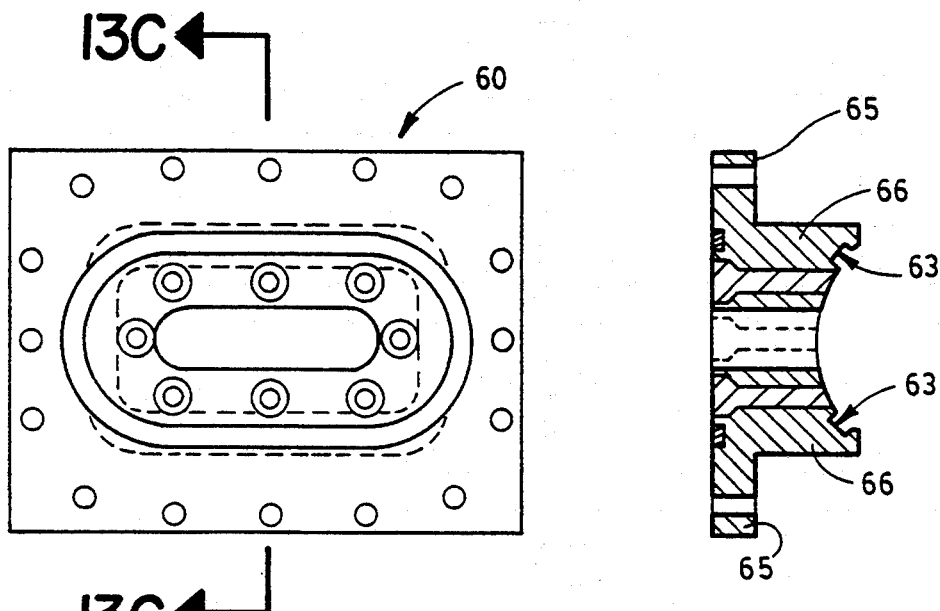
FIG. 13A
FIG. 13C
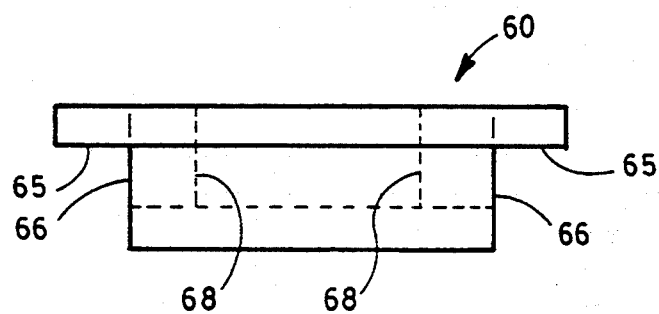
FIG. 13B

SLOTTED CYLINDRICAL HOLLOW CATHODE/MAGNETRON SPUTTERING DEVICE

This is a continuation of application Ser. No. 07/809,705, filed on Dec. 16, 1991, abandoned, for a SLOTTED CYLINDRICAL HOLLOW CATHODE/MAGNETRON SPUTTERING DEVICE, which is a continuation-in-part application of U.S. Ser. No. 550,719, filed on Jul. 10, 1990 (issued as U.S. Pat. No. 5,073,245 on Dec. 17, 1991)

BACKGROUND OF THE INVENTION

1. Field of the Invention

This invention relates generally to electrode-type glow discharge devices used in the field of thin film deposition and, more particularly, to an improved hollow cathode magnetron sputtering system that may be used for sputtering thin films onto substrates.

2. Description of Related Art

Cathodic sputtering is a well-known technique for applying a thin film of material to a substrate. The process involves placing a "target" comprised of or coated with the material to be sputtered into a chamber containing a low pressure gas. The material to be sputtered is ejected from the target by electrically connecting the target as a cathode and creating a low pressure gas discharge between the target and a nearby anode. A negative voltage is applied to the cathode at a high current level so that gas ions bombard its surface with high energy and thereby eject (sputter) atoms that will deposit on the substrate, located nearby. The process is self-sustaining because many of the incident gas ions, rather than ejecting an atom of the material to be sputtered, create a shower of electrons that collide with neutral gas atoms and create even more gas ions.

The general concept of cathodic sputtering is set forth in great detail in U.S. Pat. No. 2,146,025, issued to Penning on Feb. 7, 1939. After Penning, the advances in sputtering were few until the early sixties when, contrary to earlier thought, it was theoretically shown that sputtering was primarily due to momentum transfer between the incident ions and the target. This new theory soon led to a variety of sputtering devices having different geometries and using magnetic fields of various shapes to direct and guide the gas discharge. Such devices are generally known as magnetron sputtering devices.

For example, U.S. Pat. No. 3,884,793, issued to Penfold et al. on May 20, 1975, discloses a magnetron sputtering device having either a solid or hollow cylindrical target and using a magnetic field that is parallel to the long axis of the cylindrical surface to maintain the gas discharge near the surface of the target. Although the Penfold et al. device was an advancement in the field, its efficient use was limited to the sputtering of long cylindrical substrates such as wires or optical fibers.

Two other patents of interest, U.S. Pat. No. 3,616,450, issued to Clarke on Oct. 26, 1971, and U.S. Pat. No. 3,711,398, also issued to Clarke on Jan. 16, 1973, relate to magnetron sputtering devices having target and magnetic field geometries that make them best suited for the sputtering of silicon wafers and the like. The devices disclosed by Clarke use a cylindrical cathode with a plurality of permanent magnets disposed circumferentially around the cathode. The magnetic field of the Clarke devices pierce the cylindrical cathode in such a way that a toroidal gas discharge occurs along a portion of the cathode's interior. The Clarke devices are undesirable because the size and shape of the work pieces that may be sputtered are limited by the fact that sputtered atoms can only escape from the end of the cylinder. This spot-source mode of operation limits the device to stationary or batch-type usages rather than continuous pass-by usage. Moreover, the cathode must be replaced before it is completely used up because the gas discharge occurs along a limited portion of its surface.

At least two inventors approached the cathode geometry problem with planar substrates in mind. In particular, U.S. Pat. No. 3,878,085, issued to Corbani on Apr. 15, 1975, and U.S. Pat. No. 4,166,018, issued to Chapin on Aug. 28, 1979, both disclose sputtering devices that use a substantially planar cathode along with magnetic flux lines that bisect the planar cathode. In the preferred embodiments of both inventors, the magnetic flux lines are created so as to define a "race track" like tunnel on the surface of the cathode. The Corbani/Chapin devices are very suited to coating planar substrates. However, like the Clarke devices, the cathode/magnetic field geometry is such that the cathode wears unevenly beneath the magnetic "race track."

It was the problem of uneven cathode erosion that led to U.S. Pat. Nos. 4,356,073 and 4,422,916, both issued to McKelvey on Oct. 26, 1982 and Dec. 27, 1983, respectively. McKelvey, like Corbani and Chaplin, uses a magnetic field that bisects the cathode in order to maintain the glow discharge on the surface of the cathode. However, McKelvey used a cylindrical cathode rather than a planar cathode. McKelvey's solution to uneven erosion is to mechanically rotate the cylindrical cathode around a plurality of permanent magnets arranged longitudinally within the cathode. Although the McKelvey device solves the problem of uneven cathode erosion, it leads to further problems. Specifically, it requires additional drive components that are both costly and, like all mechanical things, prone to breaking down. Minimizing mechanical down time is particularly important where the sputtering device forms part of an assembly line, such as a mill-type environment for architectural glass or magnetic media.

SUMMARY OF THE INVENTION

The present invention is directed towards a new and different magnetron sputtering system that is suitable for depositing a thin film of sputtered material onto a substrate. The invention may be used in different embodiments suitable for the deposition of a thin film onto substrates of different geometries. Unlike the prior art devices, the present invention provides a magnetron sputtering device with a cathode that erodes evenly during operation and does not require any moving parts.

Priority application, Ser. No. 550,719, disclosed a hollow elongated cathode with a single slot serving as a collimated source of sputtered material. The present application presents a family of sputtering systems, including the single slot version, all of which are closely related to the basic elongated hollow cathode. FIGS. 1a-1e schematically depict the operation and relationship of the various sputtering system embodiments disclosed herein.

According to the invention, the magnetron sputtering system is comprised of a hollow longitudinal cathode that is either made from or has its interior wall coated with a material to be sputtered. A longitudinal wall of said cathode defines an elongated hollow central portion, or sputtering cavity, in which sputtering may occur.

An anode is placed in proximity of the cathode and a power supply is used to apply a negative potential to the cathode in order to initiate and maintain a glow discharge between the cathode and the anode. The invention also includes a means, such as permanent magnets or electromagnets, for providing magnetic flux lines that are substantially parallel to the longitudinal axis of the cathode and contiguous with the interior wall. The magnetic flux lines ensure that a glow discharge occurs near and along substantially all portions of the cathode's interior wall such that high current densities may be achieved and so that the cathode surface wears evenly.

In one "pass-through" embodiment, FIG. 1a, a solid cathode target is used for depositing a thin film on an elongated filament-like substrate. The sputtered material is contained within the interior of the cathode target because the cathode target is solid. The filament-like substrate is passed through the sputtering cavity of the cathode via apertures located at either end thereof.

In another "pass-through" embodiment, FIG. 1c, a double-slot cathode target is used for depositing a thin film on a substantially planar substrate. In this embodiment, the longitudinal wall defines a pair of opposed longitudinal apertures through which the planar "sheet-like" or web substrate may pass. Some of the sputtered material may escape through the slots, but, because of the substrate's presence in the slots, the vast majority is deposited on the substrate or recollected on the interior of the cathode target.

In a first "pass-by" embodiment, FIG. 1b, a single-slot cathode target is used for depositing a thin film on a substantially planar substrate. In this embodiment, the longitudinal wall defines a longitudinal aperture from which sputtered material may exit. A first portion of the sputtered material will escape from the longitudinal slot as a substantially collimated beam and be available for coating the substantially planar substrate as it passes by the slot. A second portion of the sputtered material will recollect on the interior of the cathode and again be available for sputtering.

In a second "pass-by" embodiment, FIG. 1e, a plurality of discrete single-slot cathode targets are used for depositing a thin film on a substantially planar substrate. The discrete single-slot cathode targets are positioned adjacent to one another to provide an array of parallel substantially collimated line sources of sputtered material.

It is an object of the present invention, to provide a modular magnetron sputtering system in which the components are cost effective to manufacture and simple to assemble and repair.

The cathode target used in the above embodiments, whether solid or slotted, is preferably comprised of a pipe-like elongated cylindrical member and a pair of annular end pieces which are removably received in the interior of the elongated cylindrical member at either end thereof. This novel construction simplifies manufacture and makes it simple to renew a worn cathode by reusing the annular end pieces with a new pipe-like elongated cylindrical member.

A water jacket, necessary to cool the cathode target, is also constructed to allow quick and easy construction during assembly or repair. The water jacket is preferably comprised of an elongated hollow member having ends of a diameter closely sized to the exterior of the cathode and, located therebetween, an elongated central interior of a larger diameter to provide a water cavity around the cathode. The annular ends of the water jacket are preferably beveled such that an O-ring may be held therein and compressed against the exterior of the cathode with a threaded annular end cap. Slight variations in the configuration of the water jacket are, of course, necessary to accommodate a single-slot or double-slot cathode member.

The preferred cathode also includes mounting flanges at either end thereof. The anodes, whether "end-anodes" or "intermediate anodes", are provided with similar mounting flanges. Through this novel arrangement, the system may be expanded as desired by connecting, end-to-end, any desired number of anodes and cathodes. Beneficially, the anodes and cathodes may be quickly and easily mounted or demounted from one another.

In a third "pass-by" embodiment, FIG. 1d, a planar array of single-slot cathode targets are used for depositing a thin film on a substantially planar substrate. In this embodiment, a plurality of elongated hollow cavities and corresponding slots are formed in a single monolithic plate. This embodiment may be visualized as a variant of the discrete single-slot cathode targets used in the second pass-by embodiment. A plurality of substantially collimated beams of coating flux are ejected from this source.

These and other benefits of the invention will be made more apparent from the following detailed description of the preferred embodiment taken together with the drawings.

BRIEF DESCRIPTION OF THE DRAWINGS

FIGS. 2a, 2b and 2c are perspective views, respectively, of a solid cathode member, a single-slot cathode member, and a double-slot cathode member, all according to the present invention;

FIG. 4 is an exploded perspective view of a preferred water jacket used to cool the solid cathode member of FIG. 2a;

FIGS. 13a, 13b, and 13c are a top view, a side view, and a sectional end view, respectively, of an insulator 60 according to the present invention;

DESCRIPTION OF THE PREFERRED EMBODIMENTS

Figure 1A:
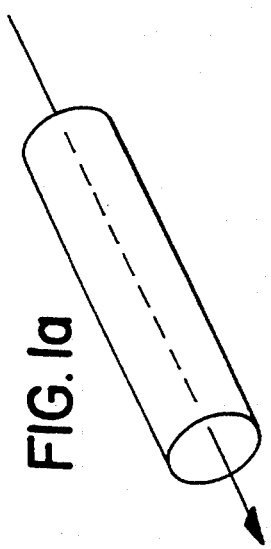
FIGS. 1a, 1b, 1c, 1d and 1e are schematic illustrations of the operation and relationship between various "pass-through" and "pass-by" embodiments of the present invention.
Figure 1B:
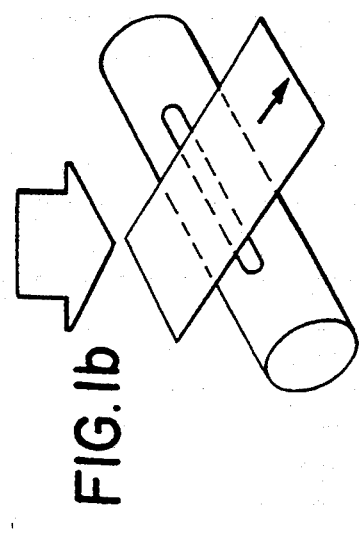
Figure 1C:
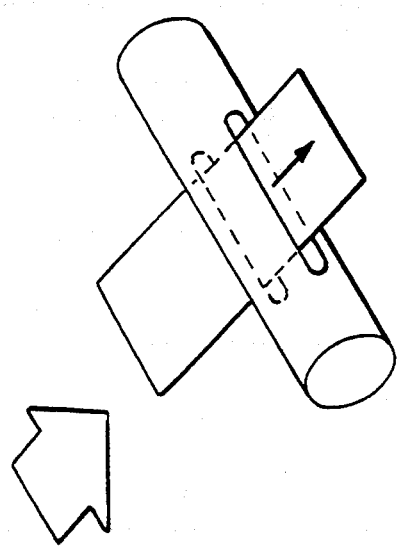
Figure 1E:
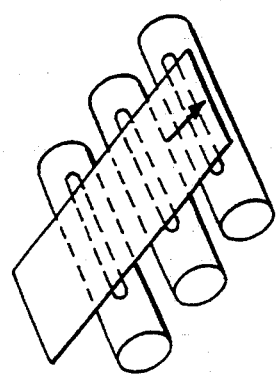
Figure 1D:
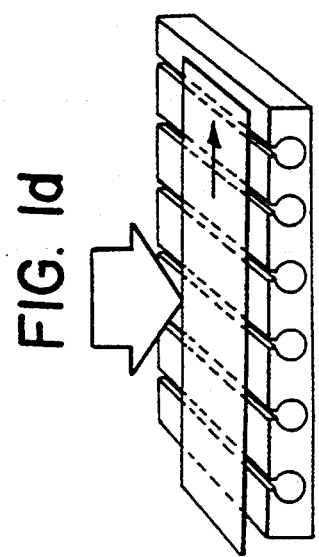

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide an improved magnetron sputtering device. As described above, the present invention has various embodiments which may be characterized as suitable for a "pass-through" or a "pass-by" sputtering operation. In a "pass-through" embodiment, a substrate is coated, as the name implies, when it passes through a sputtering cavity of the cathode target. In a "pass-by" embodiment, a substrate is coated as it passes by a slot provided in a wall of the cathode target from which a collimated beam of coating flux emerges. Both the "pass-through" and the "pass-by" embodiments may be accomplished in a modular quick-connect system comprised of multiple cathode targets.

FIGS. 2a, 2b, and 2c depict different versions of a cathode target used in various ones of the above described embodiments. Each of the cathode targets depicted in FIGS. 2a, 2b, and 2c are respectively comprised of an elongated cylindrical cathode member 20a, 20b, 20c and a pair of annular end-plugs 25, 25 (the latter shown only in FIG. 2a).

The annular end-plugs 25 are necessary to form an electron trap given a magnetic B-field which is parallel to an interior wall of the cathode member 20a, 20b, 20c. On the other hand, if the magnetic B-field intersects the interior wall of the cathode member 20a, 20b, 20c, then the end-plugs 25 are not absolutely necessary to contain the glow discharge.

As is well known in the prior art, the cathode member 20a, 20b, 20c is either constructed of or coated with at least one material to be sputtered. Where a metal is to be sputtered, the device is generally operated with DC current as known in the art. Alternatively, RF energy may be used when a nonmetal is to be sputtered.

In the preferred embodiment, each of the annular end-plugs 25 are removably attached to a corresponding end of the cylindrical cathode member 20a, 20b, 20c. The preferred means for removably attaching the end-plugs 25, 25 are threads 126 on the exterior of the end-plugs and mating threads 127 on the interior of the corresponding end of the cylindrical cathode member 20a, 20b, 20c. The annular end-plugs 25 combine with the cylindrical cathode member 20a, 20b, 20c to define a hollow flanged cathode similar to that disclosed in U.S. Pat. No. 3,884,793 issued to Alan Penfold and John Thornton on May 20, 1975, the disclosure of which is incorporated by reference as if fully set forth herein.

This novel, multicomponent construction of a hollow flanged cathode provides a cathode target, comprised of the cathode member 20a, 20b, 20c and end-plugs 25, 25, that may be cost effectively manufactured and easily renewed. All components of the cathode target, the cylindrical cathode member 20, and the end-plugs 25 have a simple straight-through pipe-like geometry. Thus, it is no longer necessary to make a cathode target by boring concentric, different-sized apertures in a single member. Moreover, since most erosion occurs on the interior of the cylindrical cathode member, renewal of the cathode target is a simple matter of installing a new pipe-like cylindrical cathode member 20 between an old pair of end-plugs 25, 25.

For use in a modular system, described further herein, each cathode member 20a, 20b, 20c preferably includes first and second mounting flanges 121, 122 at either end thereof. The mounting flanges are preferably defined by first and second annular grooves 123, 124.

The cathode member must be cooled regardless of which version is desired, be it a solid cathode member 20a (FIG. 8a), a single-slot "pass-by" cathode member 20b (FIG. 8b), or a double-slot "pass-through" cathode member 20c (FIG. 8c). A water jacket 30, described further herein with respect to each type of cathode member, is provided for this purpose.

Solid Cathode Target

A solid "pass-through" cathode member 20a is depicted in FIG. 2a. As shown, the elongated cylindrical cathode member 20a has a solid wall configuration that defines a modular, valveless, continuously-open, straight-through elongated sputtering cavity 22.

Figure 3A:
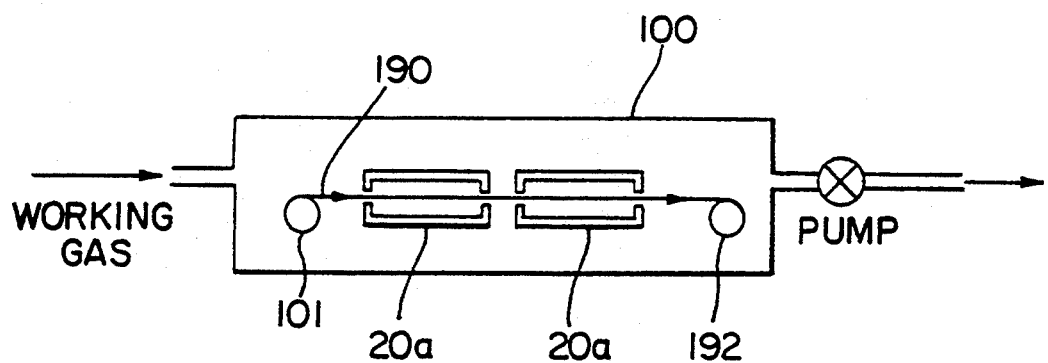
FIGS. 3a, 3b and 3c are schematic illustrations of three applications for coating a wire-like filament with the solid cathode members 20a of FIG. 2a, the first showing the cathode members 20a being fully enclosed in an independent vacuum system, the second showing the cathode members 20a as forming an integral part of a vacuum system, and the third being an air-to-air differential pumped system.

FIG. 3a schematically depicts a pair of solid cathode members 20a being used to coat a filament-like substrate 190 fed continuously from one reel 191 to another reel 192.

Figure 3B:
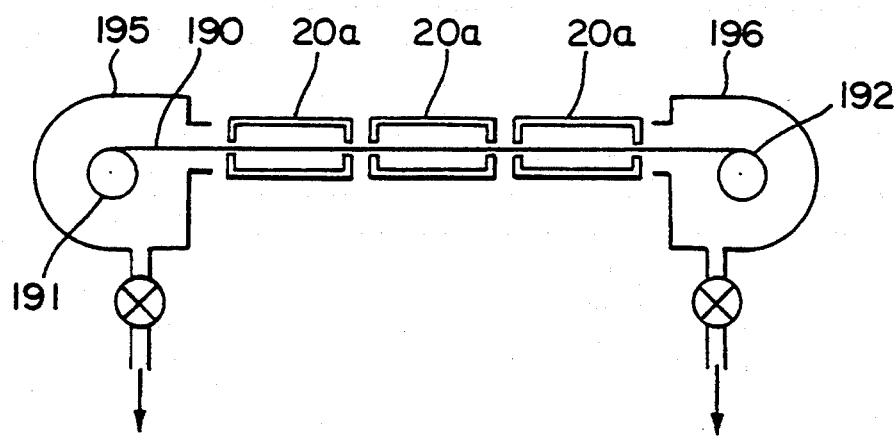

FIG. 3b schematically depicts a continuous reel-to-reel wire and fiber coating system wherein the cathode members 20a and anodes (not shown) form an integral part of the vacuum system, located between a vacuum pumped feed chamber 195 and a vacuum pumped take-up chamber 196.

Figure 3C:
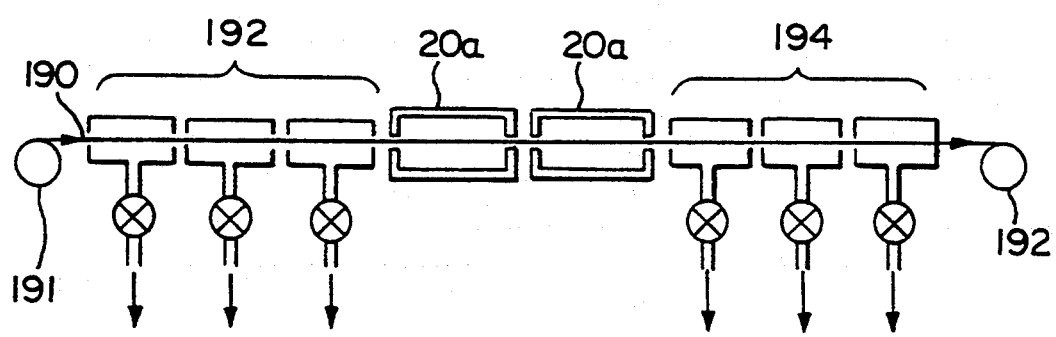
Figure 5:
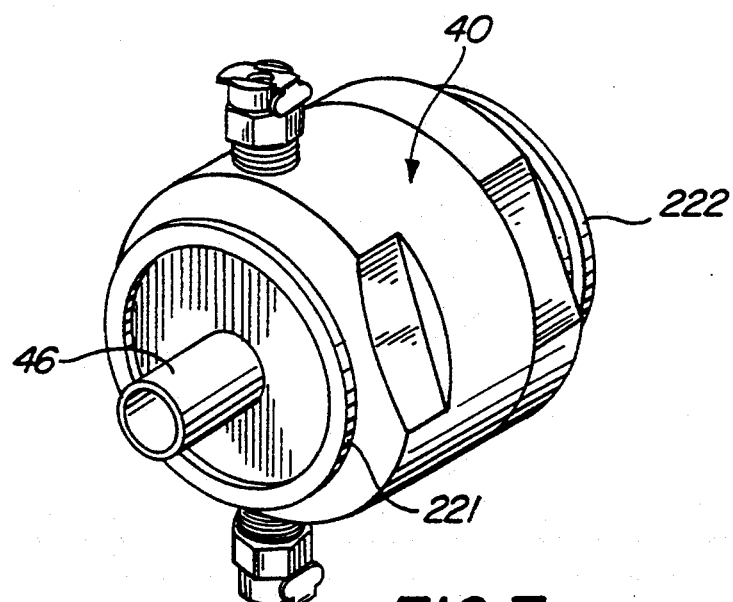
FIG. 5 is a perspective view of a preferred "end-anode" according to the present invention.

FIG. 3c schematically depicts a pair of solid cathode members 20a in a modular, valveless, continuously-open, straight-through air-to-air differential pumping embodiment. In this arrangement, the filament-like substrate 190 enters and exits at ambient. A differential pumping entrance 192 and a differential pumping exit 194, despite the openings between pumping stations, maintains the requisite low pressure necessary for sputtering in the cathode members 20a.

The foregoing systems may be used, for example, to manufacture such items as: (A) electrically conductive fibers made by depositing a thin conductive film of copper or aluminum onto a flexible filament-like substrate (the conductive coating may then, if desired, be etched lengthwise to provide two or more separate conductors); (B) an X-ray opaque catheter for angioplasty made by depositing a material, such as tungsten over chromium, onto a polyimide fiber; (C) a composite fiber having good bonding characteristics for adhesion in a matrix, made by depositing, for example, chromium onto a polymer fiber; (D) a hermetically protected optical fiber made by depositing such materials as carbon, titanium, or titanium nitride thereon; (E) a radar transparent/absorbing fiber made by depositing ferrite onto a carbon fiber; or (F) an oxidation-resistant fiber made by depositing aluminum nitride and silicon carbide (SiC/AiN) onto a ceramic fiber.

A preferred water jacket 30 for use with the sold cathode target of FIG. 8a is depicted in FIG. 4. The water jacket 30, as its name suggests, encases the cathode member 20 in order to allow cooling water to circulate thereabout. Because of the high voltages used in sputtering, the water jacket 30 should be comprised of a material that is a good electrical insulator such as ceramic, nylon, teflon, Delrin, or polyvinylchloride (Pvc).

Figure 7A:
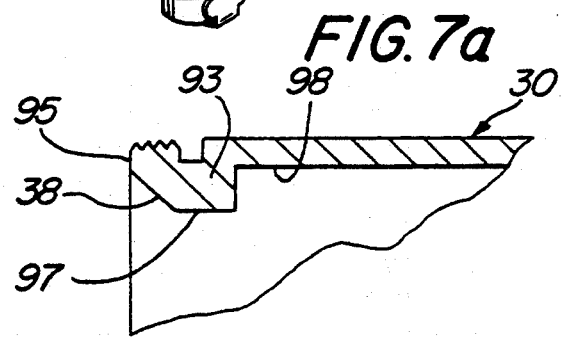
FIGS. 7a and 7b are partial cross-sectional views, taken along section lines 6—6, of the structure of FIG. 4, the former being of the water jacket alone, and the latter being of the water jacket, cathode member, O-ring, and annular end-cap nut.

The preferred water jacket 30 has a cylindrical body 37 with first and second annular end portions 93, 94 at either end thereof. First and second openings 91, 92 are provided on opposite sides of the cylindrical body 37. Going from the outside and radially inward, the first annular end portion 93 is comprised of a flat annular end face 95, a concentric annular bevel 96, and an annular wall 97 which defines an aperture closely sized to an exterior diameter of the cylindrical cathode target 20 (See FIGS. 7a and 7b). An elongated cylindrical interior 98 is defined between the first and second annular end portions 93, 94. The diameter of the cylindrical interior 98 is larger than that of the annular wall 97 and the exterior of the cathode member 20 to define a water cavity for cooling.

Figure 7B:
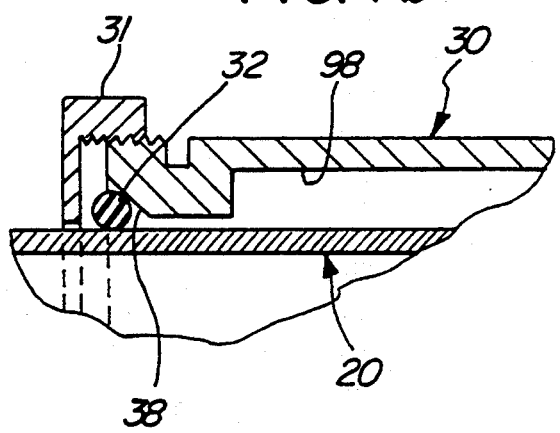
Figure 6:
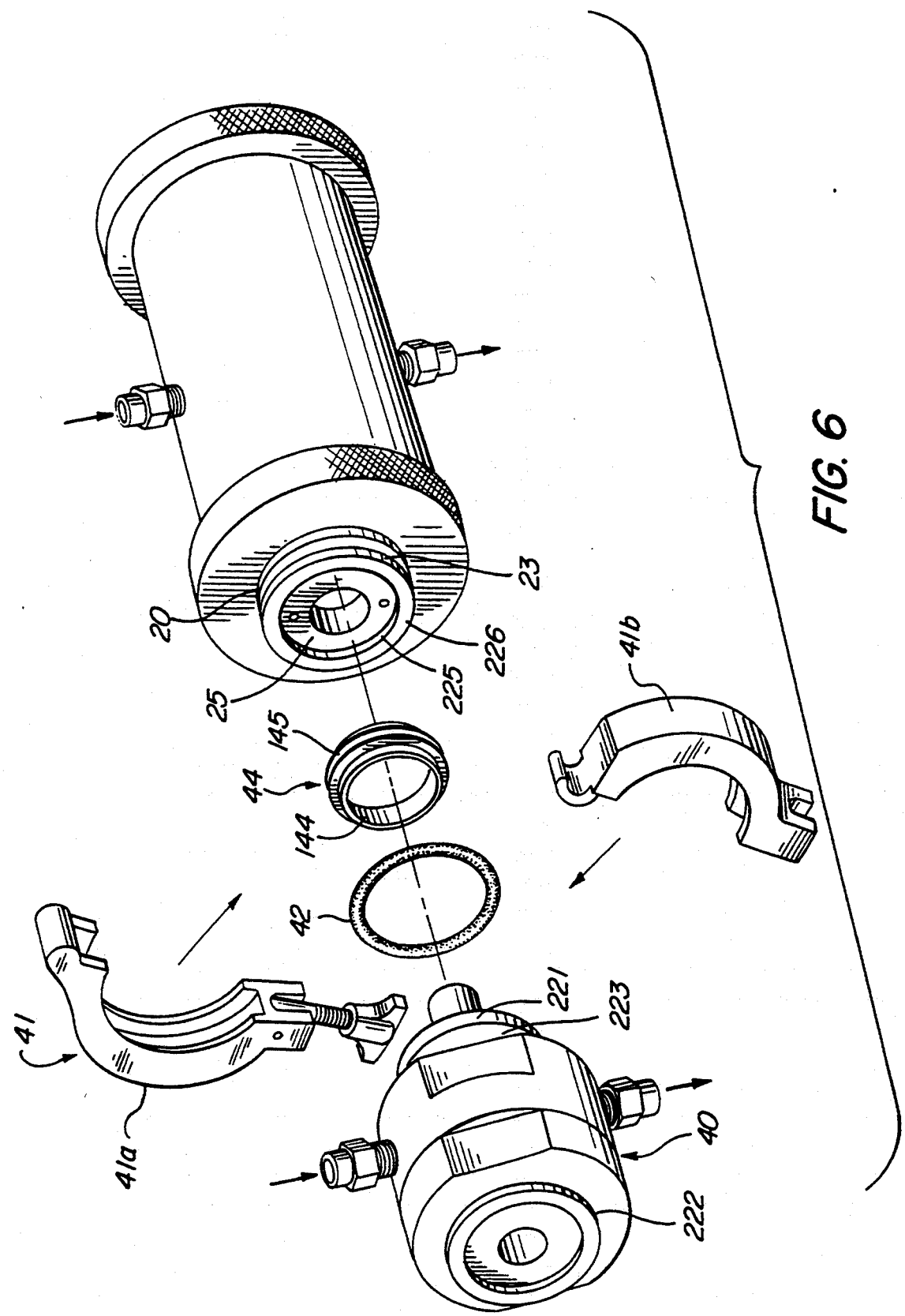
FIG. 6 is an exploded perspective view of a preferred means for connecting an anode, in this case an "end-anode," to a cathode member according to the present invention.

As suggested in FIG. 4 and shown in FIG. 7b, the water jacket 30 slides onto the cathode target 20. The water jacket is preferably shorter than the cathode target 20 so that the first and second mounting flanges 23, 23, along with a portion of the cathode target 20, protrude from either end thereof. A pair of O-rings 32 are slid beyond each mounting flange 23, 23 and onto the protruding portions of the cathode target 20. Each O-ring 32 fits into an annular recess (not separately numbered) defined between the cathode target 20 and the annular bevel 96 of the water jacket 30. An annular end cap 31 is then threaded onto the water jacket 30 to tightly compress the O-ring 32 against the annular bevel 96 and the water jacket. Water, under the force of a pumping system (not shown), enters through the first opening 91 on one side of the water jacket 30 and exits through the second opening 92 on the other side of the water jacket 30.

Also necessary is a magnetic means for producing a magnetic field inside of the cathode member 20a for creating a physical trap to contain the electrons of the glow discharge. The magnetic field should be substantially parallel and adjacent to the interior wall which defines the sputtering cavity 22. If the magnetic field is curved at the ends, such that it intersects the longitudinal wall of the cathode member 20a, then the end-plugs 25 are not needed. However, if the magnetic field does not intersect the wall of the cathode member 20a, then the end-plugs 25 are needed to fully enclose the glow discharge between the magnetic field, the cathode member 20a, and the end-plugs 25. The magnetic means may take any variety of forms such as a plurality of bar magnets (e.g., magnets 80 shown in FIGS. 8 and 9, discussed below), a plurality of toroidal magnets (solid in the case of solid cathode member 20a and split in the case of single-slot cathode member 20b), or an electromagnet.

Single-Slot Cathode Target

A single-slot "pass-by" cathode target is depicted in FIG. 2b where, as shown, the elongated cylindrical cathode member 20b has a single slot 26 formed in a longitudinal wall thereof. The single-slot pass-by cathode member 20b is used for depositing a thin film on a planar substrate passed by the slot 26 adjacent to the cathode target.

Figure 10:
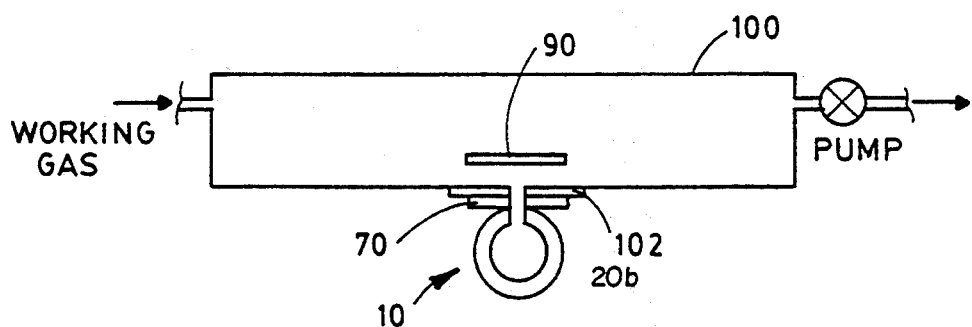
FIG. 10 is a diagrammatic elevational end view of the device of FIG. 2b positioned within a vacuum chamber 100 and below a moving planar substrate 90 to be coated.
Figure 11C:
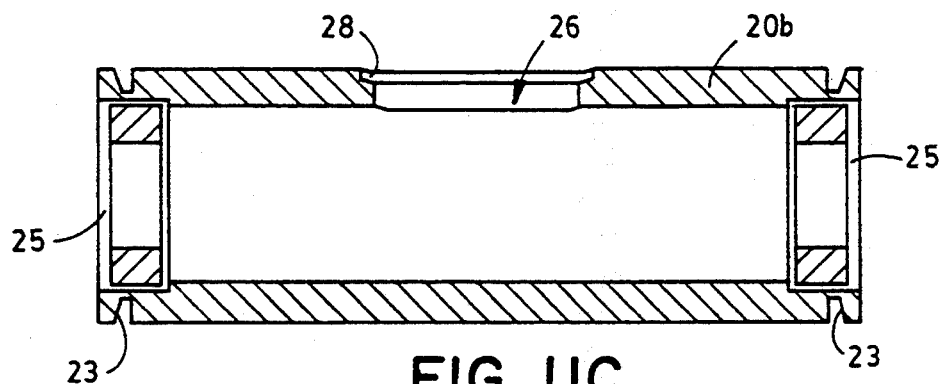
FIGS. 11a, 11b, and 11c are a top view, a sectional side view, and an end view, respectively, of the cylindrical cathode member 20b and end-plugs 25 according to the present invention.
Figure 11A:
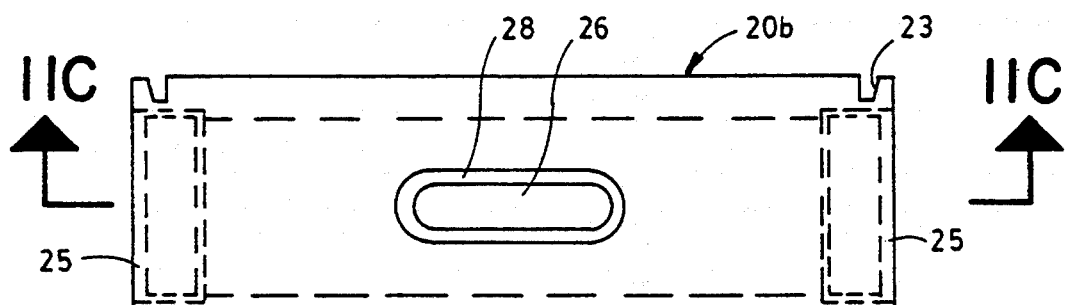
Figure 11B:
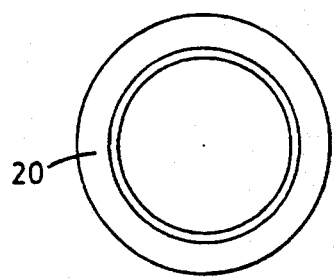
Figure 12A:
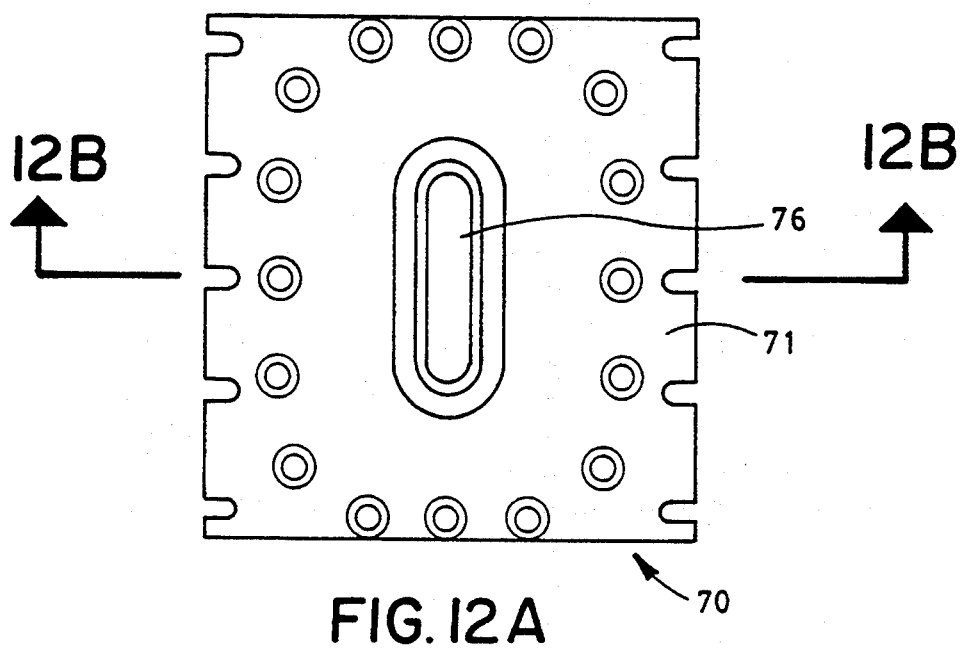
FIGS. 12a and 12b are a top view and a sectional side view, respectively, of a flange member 70 according to the present invention.
Figure 12B:
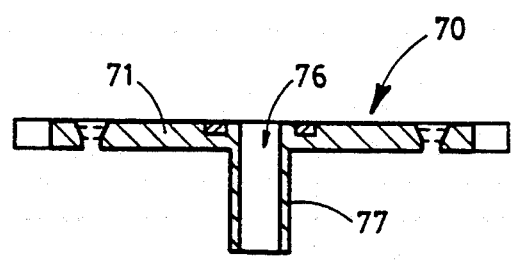
Figure 14A:
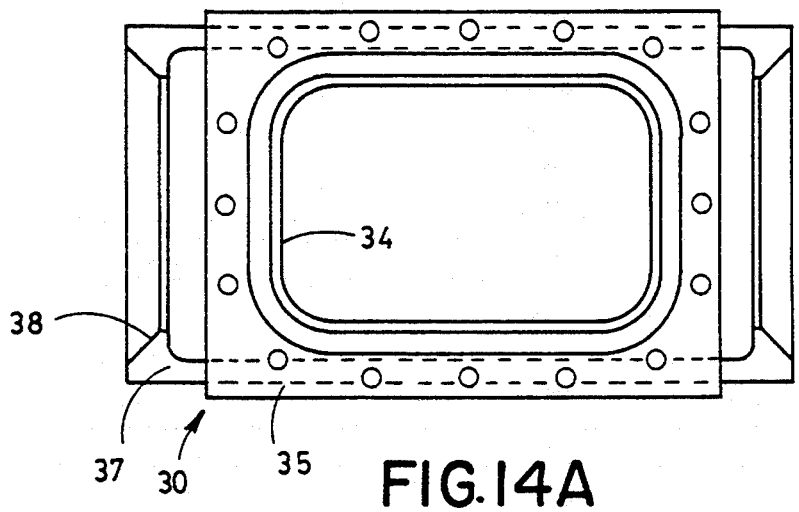
FIGS. 14a, 14b, and 14c are a top view, a side view, and an end view, respectively, of a water jacket 30 according to the present invention.
Figure 14B:
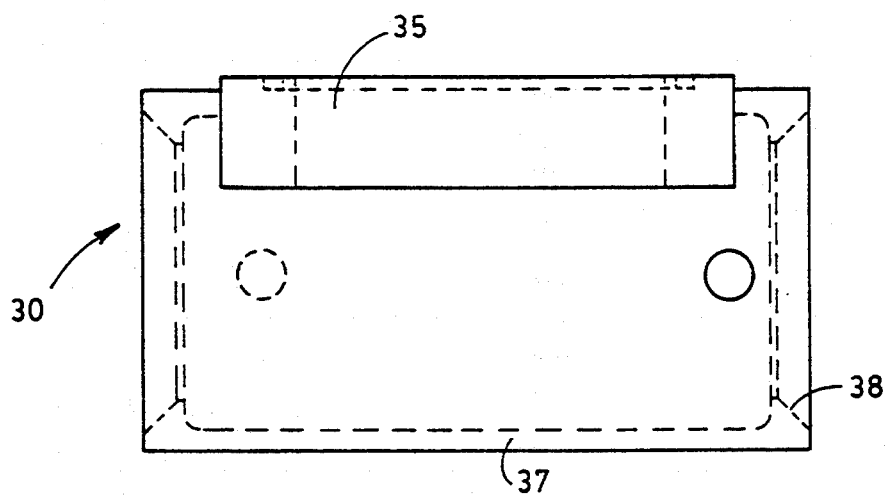
Figure 14C:
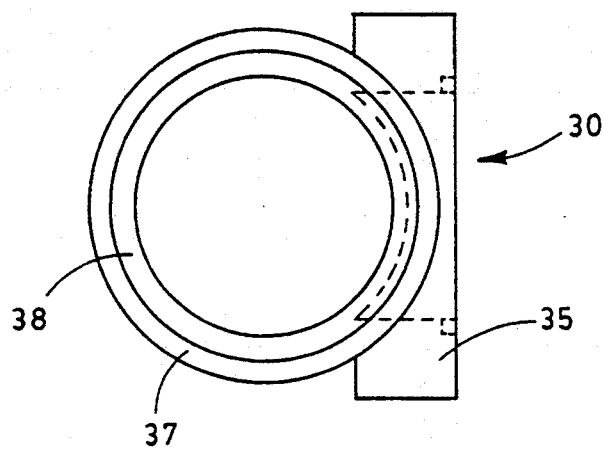

A first pass-by embodiment is schematically shown in FIG. 10. A vacuum chamber 100 having a magnetron sputtering device 10b, employing the cathode member 20b of FIG. 2b, is mounted to a support flange 102 carried by the chamber 100. A planar substrate 90 is placed adjacent to the magnetron sputtering device 10b in order to coat the substrate 90 with sputtered atoms 12 that are emitted from the slot in the side of the cathode member 20b. The substrate 90 may be stationary or, as represented by an arrow in FIG. 10, the substrate 90 may be moved relative to the magnetron sputtering device in order to coat a larger area.

Figure 8:
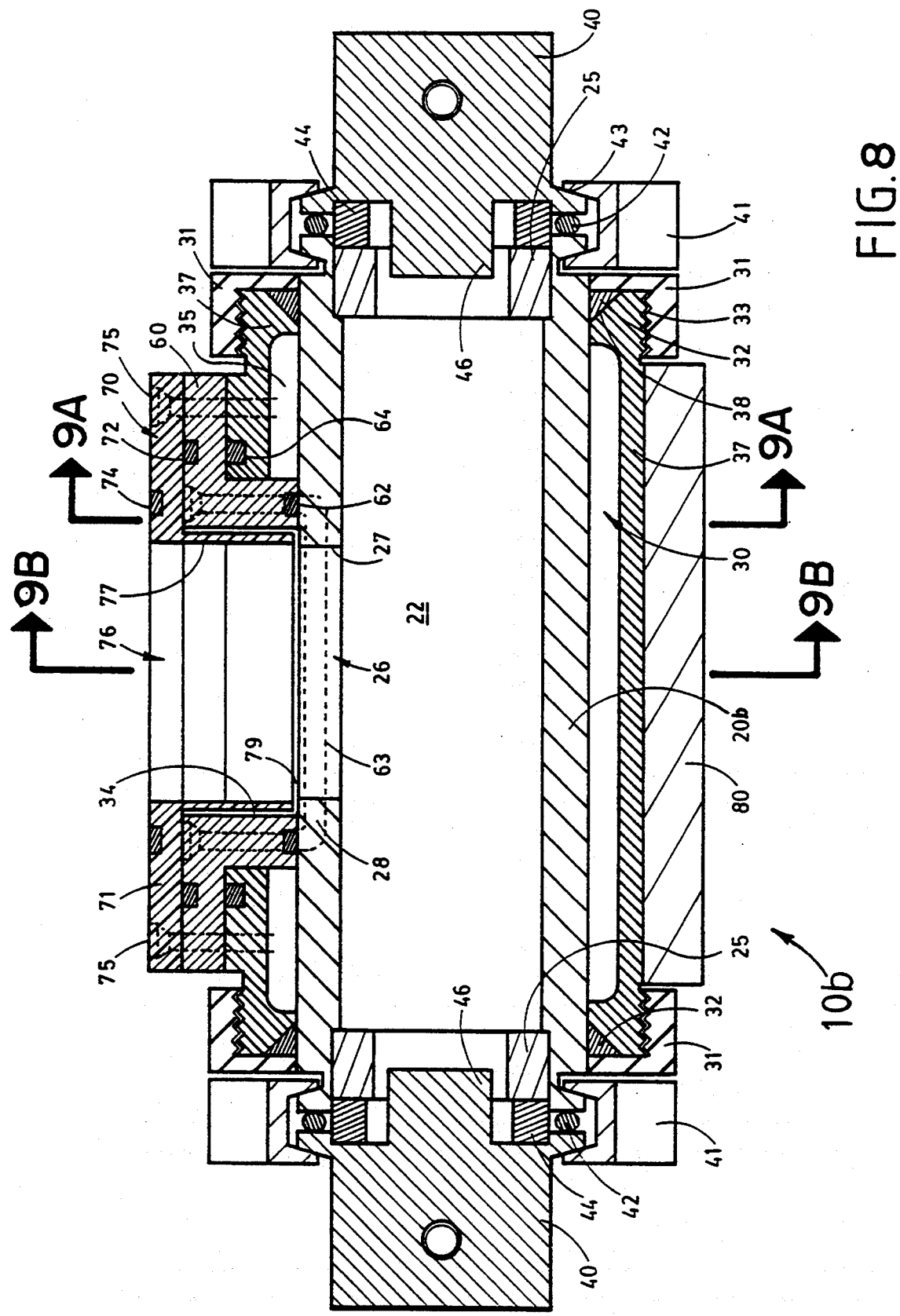
FIG. 8 is an axial cross-section of an application for coating a substantially planar substrate according to the present invention.
Figure 9:
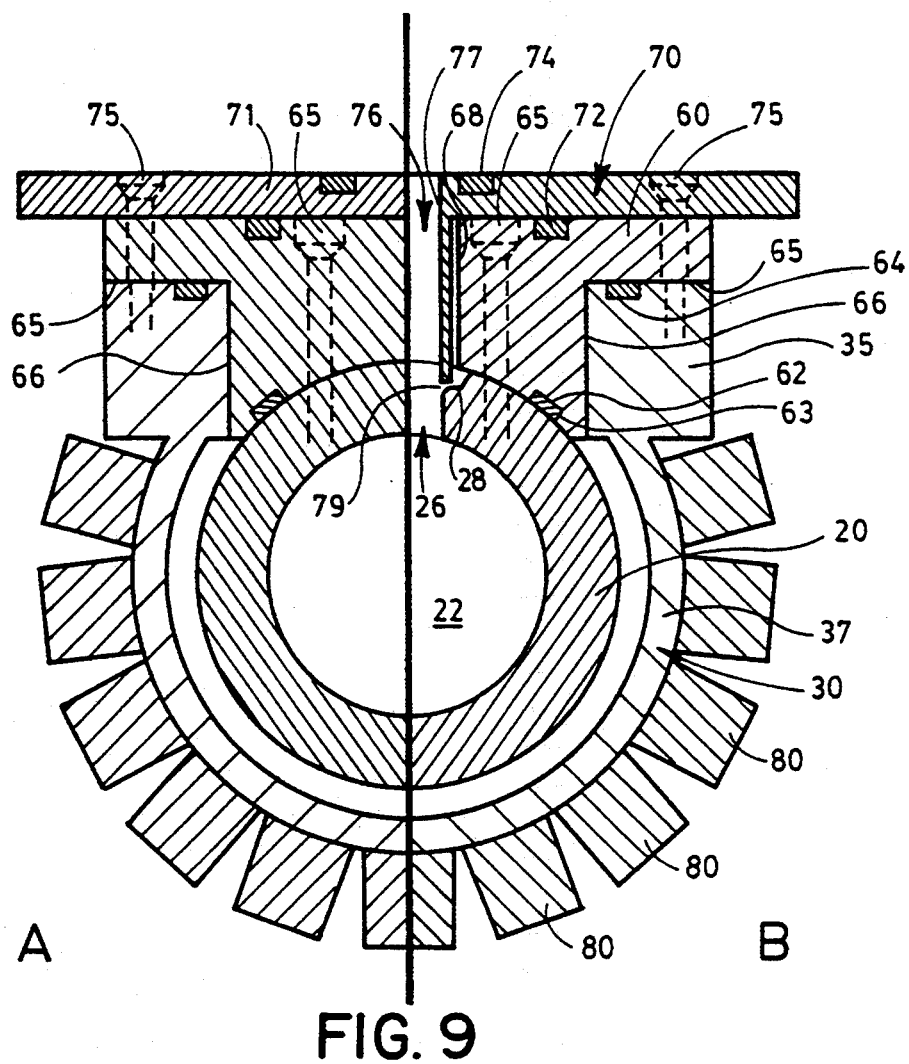
FIG. 9 is a radial cross-section of the device of FIG. 1.

The actual construction of the preferred embodiment is best understood with reference to FIGS. 8 and 9, and in particular, with reference to component FIGS. 11 through 14.

A pair of anodes 40 are positioned near the cathode wings 25 and on either side of the cathode member 20. In order to provide a continuous circuit for maintenance of a glow discharge, the anodes 40 include end portions 46 that are exposed to the sputtering cavity 22 through the annular cathode wings 25. The anodes 40 are releasably fastened to the cylindrical cathode member 20 with annular retaining members 41 that engage an anode mounting flange 43 and a cathode mounting flange 23. A pair of annular insulators 44 are disposed between the cathode member 20b and each anode 40 to prevent direct electrical contact therebetween and a pair of O-rings 42 are used to seal anodes 40 against the cathode member 20. It is understood that the exact interrelationship between the anodes 40 and the hollow flanged cathode defined by the cathode member 20b and the cathode wings 25 may be other than as defined herein.

As suggested by FIG. 10, a slotted flange member 70 is provided for mounting the sputtering device 10 to a support flange 102 (mounting means not shown). The flange member 70 is preferably constructed of aluminum or stainless steel. Referring to FIGS. 8 and 9, the flange member 70 includes an upper plate 71 and a lip 77 that extends downwardly therefrom. The lip 77 defines a flange slot 76 that is substantially in line with the cathode slot 26 when the sputtering device 10 is assembled. An O-ring 74 is provided to make a good seal around the periphery of the flange slot 76 and between the exterior of the support flange 102 and the upper surface of the upper plate 71.

A slotted insulator 60 is connected to the slotted flange member 70 at the underside of the flange plate 71 with fasteners 75. The cathode member 20 itself is then connected to the insulator 60 with fasteners 65. As shown in FIG. 2, the insulator 60 includes a slot 68 through which the lip 77 of the flange member 70 may extend. In order to isolate the cathode slot 26 from a water jacket 30 (described further herein) carried by the insulator 60, the insulator 60 includes a channel 63 along a surface of the insulator 60 that surrounds cathode slot 26. A cathode slot O-ring 62 is placed in the channel 63 and then compressed against the cathode member around the perimeter of cathode slot 26 with the fasteners 65.

In combination with the single-slot "pass-by" cathode member 20, the water jacket 30 is further comprised of a mounting block 35 (FIGS. 14a–c) so that the water jacket 30, like the insulator 60, may be supported from the flange member 70 by the fasteners 75. The mounting block 35 has an internal aperture 34 that is sized to engage a vertical peripheral wall 66 of the insulator 60 and an upper surface that engages a horizontal peripheral wall 65 of the insulator 60. The mounting block 35 is connected to the horizontal peripheral wall 65 of the insulator 60 with the fasteners 75. The lip 77 of the flange member 70 may pass through the aperture 34 of the water jacket 30. As described earlier, the end cap nuts 31 are placed around the cylindrical cathode member 20 and screwed onto the threads 33 carried at opposite ends of the water jacket 30. In order to create a water tight seal, each end cap nut 31 compresses an O-ring 32 between the outer wall of the cathode member 20 and annular beveled edges 38 provided at opposite ends of the water jacket's cylindrical body 37.

Figure 15:
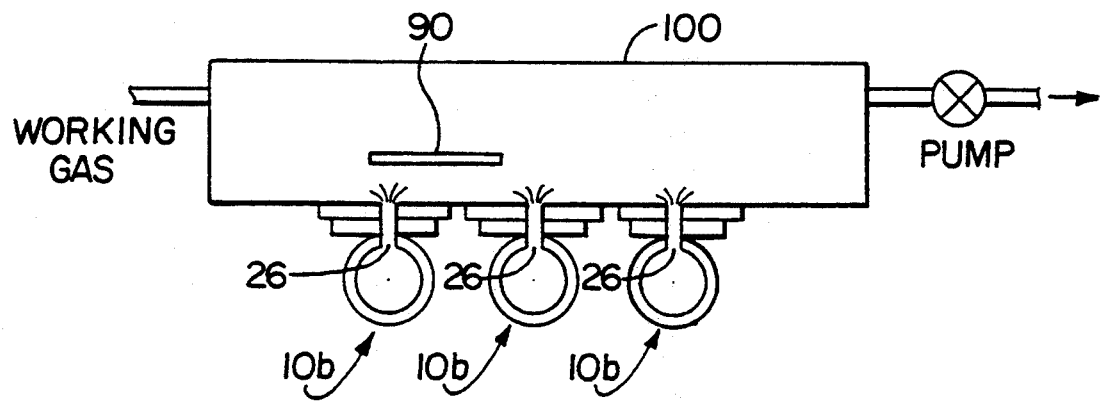
FIG. 15 is a diagrammatic elevational end view of a plurality of the devices of FIG. 2b positioned within a vacuum chamber 100, thereby defining a planar array of line sources.

A second pass-by embodiment is schematically shown in FIG. 15. In this embodiment, a plurality of magnetron sputtering devices 10b using single slot cathode members 20b (FIG. 2b) are arranged adjacent to one another with their slots 26 in parallel. By this arrangement, the planar substrate 90 may be more fully coated with a substantially collimated flux in a single pass by the plurality of sputtering devices.

Figure 16:
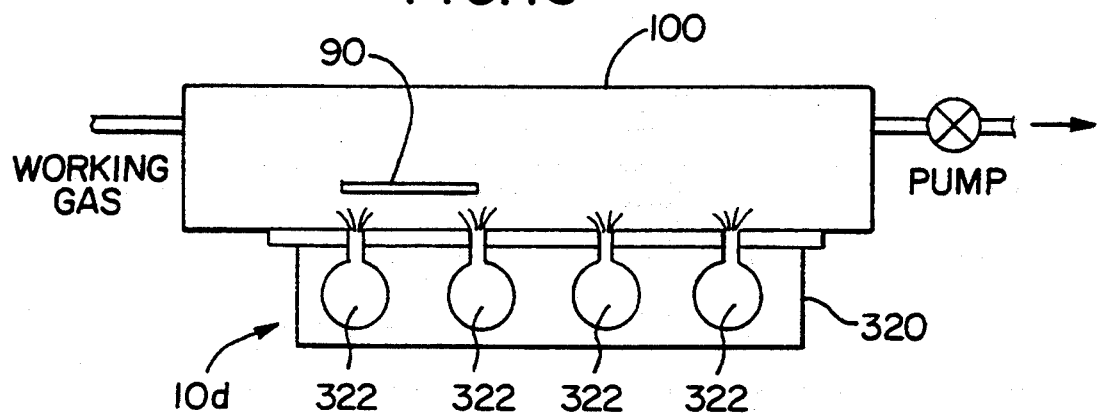
FIG. 16 is a diagrammatic elevational end view of an alternative application for coating a substantially planar substrate according to the present invention, this embodiment being based upon a single monolithic cathode slab.
Figure 17:
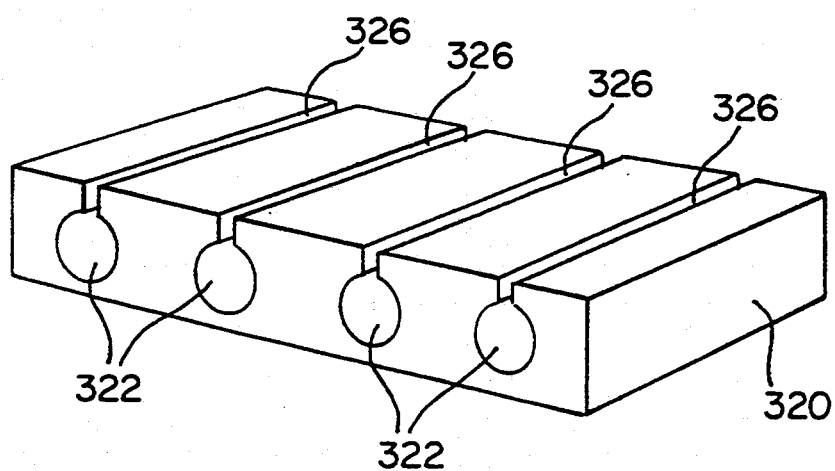
FIG. 17 is a perspective view of the single monolithic cathode slab of FIG. 16.

A third pass-by embodiment is schematically shown in FIGS. 16 and 17, where the discrete sputtering devices 10b of FIG. 15 are replaced by a single planar array 10d of slotted sputtering cavities formed in a single monolithic cathode slab 320.

Figure 19:
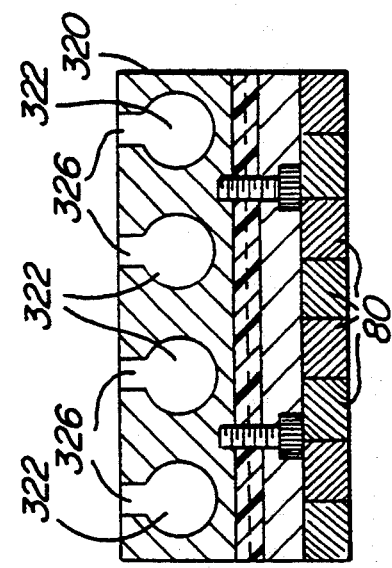
FIG. 19 is an elevational end view of the device shown in FIG. 18.
Figure 18:
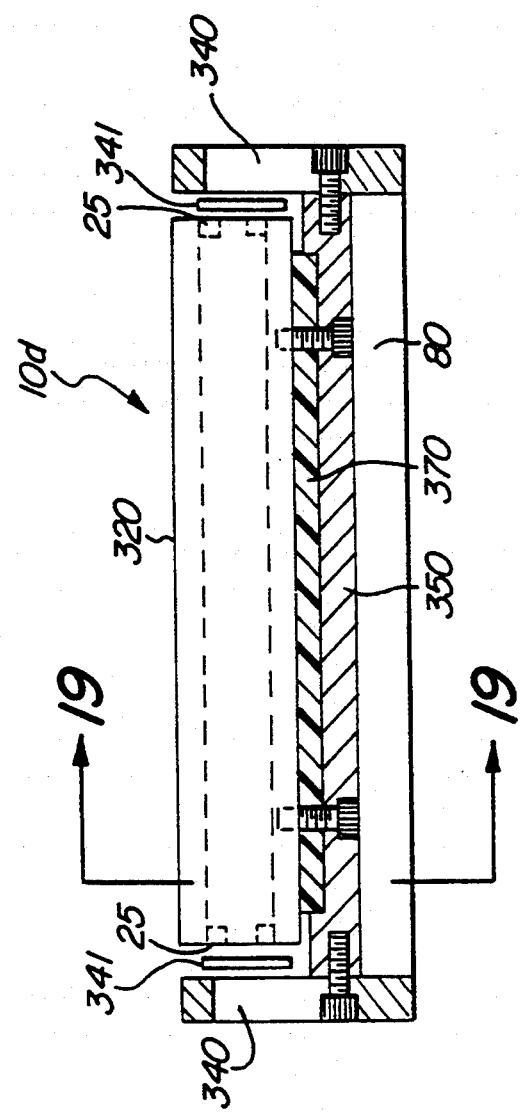
FIG. 18 is an elevational view of a currently-preferred embodiment incorporating the single monolithic cathode slab of FIG. 17.

A currently preferred construction of the planar array 10d, being used for testing at the time of this writing, is shown in FIGS. 17, 18, and 19. It is understood that a water jacket, or some other form of cooling, is necessary to operate the planar array 10d for any extended period of time. A plurality of sputtering cavities 322 and slots 326 are formed in the cathode slab 320, for example, with conventional milling or extrusion techniques. The sputtering cavities 322 are shown as circular in cross-section. However, the sputtering cavities 322 may be provided in any of a variety of shapes, such as triangular, elliptical, or rectangular, etc. The sputtering cavities 322 of cathode slab 320, like each of the cylindrical cathode members 20a, 20b, 20c, are either constructed of or else coated with the material to be sputtered. In accordance with the invention, a plurality of bar magnets 80 may be used to provide a magnetic field along the interior wall of each sputtering cavity 322. The bar magnets 80 need not surround each individual sputtering cavity 322. Endplugs 25 may be provided at either end of each sputtering cavity 322, where necessary, to physically trap the glow discharge given a parallel magnetic field, effectively forming a plurality of hollow-winged cathode targets.

End members 340, made of steel for example, serve as a B-field shunt. The height of the end members 340 may need to be empirically determined in order to eliminate plasma from occurring in the slots 326. The end members 340 are connected to one another with a base member 350. The end members 340 may double as anodes or, alternatively, a separate anode plate 341 may be provided adjacent each group of sputtering cavities 322, as shown. An insulator block 370 electrically separates the cathode slab 320 from the base member 350.

The advantages of the planar array 10d are many. As with a plurality of discrete sputtering devices 10b (FIG. 14), a planar substrate 90 may be adequately coated in a single pass with a substantially collimated beam of coating flux. The cathode slab 320, comprised of sputtering cavities 322 and corresponding slots 326, is simple and inexpensive to manufacture, making the planar array 10d inexpensive to operate.

Double-Slot Cathode Target

A double-slot "pass-through" cathode member 20c is depicted in FIG. 2c where, as shown, the elongated cylindrical cathode member 20c has a pair of diametrically opposed slots 26, 12b formed in the longitudinal wall thereof. The double-slot pass-through cathode member 20c is used for depositing a thin film on a substrate which is passed through the sputtering cavity 22 of the cathode member 20c, through one slot 26 and out the other slot 12b (or vice versa).

Figure 20:
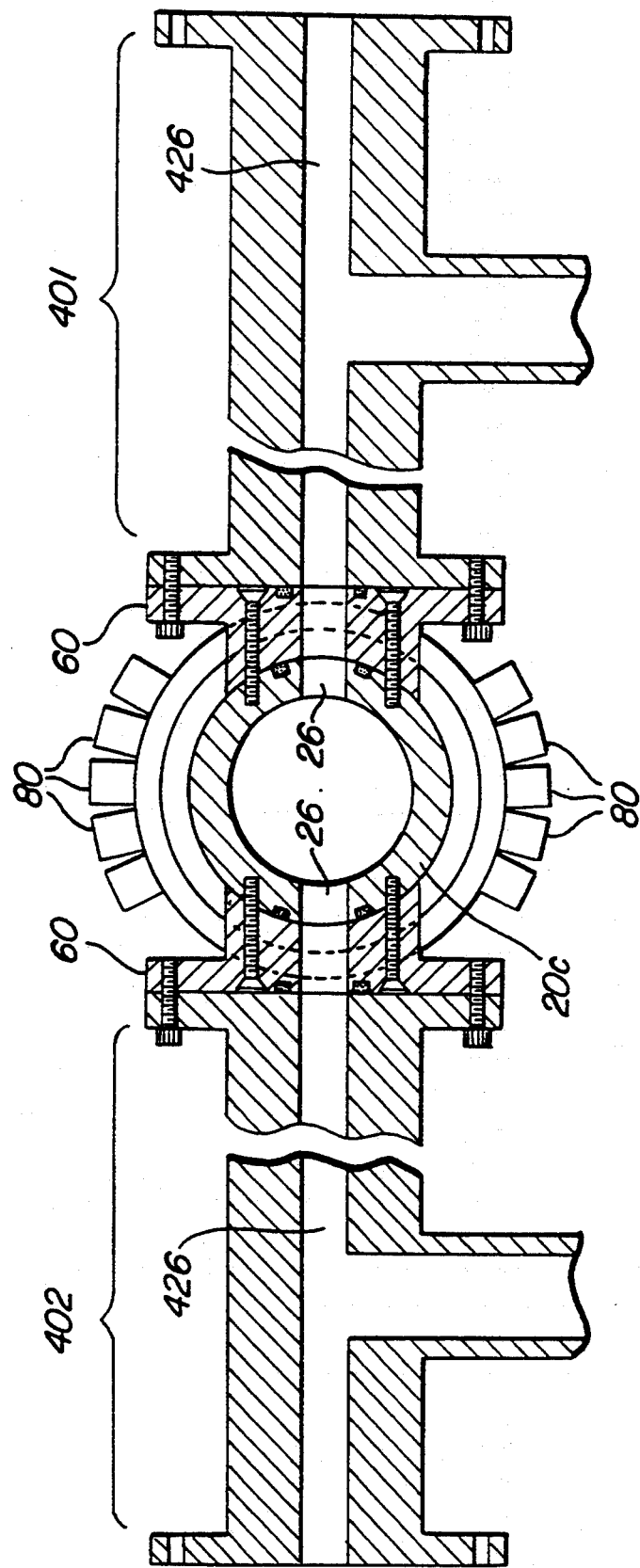
FIG. 20 is a cross-sectional end view of the device of FIG. 2c arranged between differential vacuum entry and exit stages to provide an air-to-air sputtering system.

A second pass-by embodiment, using the double-slot cathode member 20c is depicted in FIG. 20. In this embodiment, the slots 26 of the cathode member 20c are part of a continuous, air-to-air circuit 426 through which a planar substrate may be drawn. An entry stage 401 is provided on one side of the cathode member 20c and an exit stage 402 is provided on the other side. A pair of slotted insulators 60, like that shown in FIGS. 13a–13c, connect the respective slots 26 to the entry and exit stages 401, 402. A series of constant action pumping stations (not separately shown) progressively reduce the pressure from ambient, at the outside of the entry and exit stages, to the low pressure necessary for maintaining a glow discharge within the cathode member 20c. A plurality of double-slot cathode members 20c could, of course, be used in series when desired. In addition, though an air-to-air arrangement is shown, the double slot cathode member 20c may be used in an encasing vacuum chamber 100 such as that shown in FIGS. 3a and 10.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A hollow cylindrical cathode target for use with an anode in sputtering a material onto a substrate, comprising:

an elongated electrically conductive cylindrical member having an elongated exterior surface and an elongated cylindrical bore extending along a longitudinal axis of the elongated cylindrical member from a first end thereof to a second end thereof, said bore defining a cylindrical interior surface, at least the cylindrical interior surface being comprised of the material to be sputtered, the cylindrical interior surface of said elongated cylindrical member consumable over time as a result of sputtering the material onto the substrate;

first and second electrically conductive annular flanges having an external diameter sized to fit into and conductively contact the elongated cylindrical member within the bore of said elongated cylindrical member, each of said annular flanges removably located in the bore at a respectively numbered end of said elongated cylindrical member; and means for detachably securing said annular flanges within said bore without separate fasteners and without exposing any connective seam between the elongated cylindrical member and the annular flanges on the elongated exterior surface of the cylindrical member to minimize the possibility of a vacuum leak, said securing means comprised of internal threads located in the bore at the first and second ends of said elongated cylindrical member and corresponding external threads located on the exterior of the first and second annular flanges, whereby the assembly and replacement of said hollow cylindrical cathode target is simplified, whereby said flanges may be reused with a new replacement elongated cylindrical member after consumption of a first elongated cylindrical member, and whereby potential vacuum leaks due to exposure of any connective seam are eliminated.

2. The hollow cylindrical cathode target of claim 1 further comprising:

magnetic means for providing magnetic flux lines within the interior and substantially parallel to the longitudinal axis of the elongated cylindrical member, said magnetic flux lines being substantially contiguous to all portions of the interior wall such that an plasma may be contained adjacent to substantially all portions of the interior wall during the sputtering process; and an aperture extending between the cylindrical interior surface and a cylindrical exterior surface of said elongated cylindrical member whereby some of the atoms sputtered from the cylindrical interior surface will travel through the aperture and other of the atoms sputtered from the cylindrical interior surface will redeposit on the cylindrical interior surface.

3. The hollow cylindrical cathode target of claim 2 wherein said aperture is an elongated slot parallel to the longitudinal axis of the elongated cylindrical member.

4. The hollow cylindrical cathode target of claim 1 further comprising a pair of apertures, each aperture extending between the cylindrical interior surface and a cylindrical exterior surface of said elongated cylindrical member, one of said pair of apertures on one side of said elongated cylindrical member and another of said pair of apertures on an opposite side of said elongated cylindrical member, whereby the substrate may enter the cylindrical bore of said elongated cylindrical member through the aperture located on the one side and exit through the aperture located on the opposite side.

5. The hollow cylindrical cathode target of claim 4 wherein said aperture is an elongated slot parallel to the longitudinal axis of the elongated cylindrical member.

6. A magnetron sputtering apparatus for sputtering a thin film of material onto a substantially planar substrate comprising:

a monolithic slab of electrically conductive material;

a plurality of parallel elongated cylindrical straight-line sputtering cavities provided in said monolithic slab of electrically conductive material;

magnetic means for providing a magnetic field inside of each sputtering cavity and substantially parallel to the long axis of the sputtering cavity to trap a sputtering plasma along substantially an entire length of the sputtering cavity; and a plurality of parallel elongated discharge slots extending along a top surface of said monolithic slab and between the top surface and a corresponding sputtering cavity, each elongated discharge slot providing a collimated source of sputtered material from a corresponding sputtering cavity for coating the substantially planar substrate passing thereby.

* * * * *